United States Patent
Briere

(10) Patent No.: US 9,202,687 B2
(45) Date of Patent: *Dec. 1, 2015

(54) FABRICATION OF III-NITRIDE LAYERS

(71) Applicant: International Rectifier Corporation, El Segundo, CA (US)

(72) Inventor: Michael A. Briere, Scottsdale, AZ (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/229,732

(22) Filed: Mar. 28, 2014

(65) Prior Publication Data

US 2014/0213046 A1 Jul. 31, 2014

Related U.S. Application Data

(63) Continuation of application No. 13/788,318, filed on Mar. 7, 2013, now Pat. No. 8,692,219, which is a continuation of application No. 12/006,562, filed on Jan. 3, 2008, now Pat. No. 8,395,132.

(60) Provisional application No. 60/937,101, filed on Jun. 25, 2007.

(51) Int. Cl.
| | |
|---|---|
| *G21K 5/00* | (2006.01) |
| *H01L 21/02* | (2006.01) |
| *C30B 29/40* | (2006.01) |
| *C30B 33/04* | (2006.01) |
| *H01J 37/317* | (2006.01) |
| *H01L 21/265* | (2006.01) |
| *H01L 29/20* | (2006.01) |

(52) U.S. Cl.
CPC .......... *H01L 21/0257* (2013.01); *C30B 29/403* (2013.01); *C30B 33/04* (2013.01); *H01J 37/3171* (2013.01); *H01L 21/024* (2013.01); *H01L 21/0262* (2013.01); *H01L 21/02381* (2013.01); *H01L 21/02573* (2013.01); *H01L 21/26546* (2013.01); *H01J 2237/188* (2013.01); *H01L 29/2003* (2013.01)

(58) Field of Classification Search
USPC .................. 250/396 R, 492.1, 492.2, 492.22, 250/492.21, 492.3; 438/56, 57, 160, 474, 438/480, 506, 514, 515, 519, 520, 766, 795, 438/798

See application file for complete search history.

(56) References Cited

U.S. PATENT DOCUMENTS

| | | | |
|---|---|---|---|
| 3,747,203 A | 7/1973 | Shannon | |
| 4,514,636 A | 4/1985 | King | |
| 4,698,233 A | 10/1987 | Ohira | |
| 4,774,416 A | 9/1988 | Askary | |
| 5,385,862 A | 1/1995 | Moustakas | |
| 5,637,146 A * | 6/1997 | Chyi | ............. 117/200 |
| 5,866,925 A | 2/1999 | Zolper | |
| 6,329,215 B1 | 12/2001 | Porowski | |

(Continued)

FOREIGN PATENT DOCUMENTS

| | | |
|---|---|---|
| JP | 2001-308196 | 11/2001 |
| JP | 2009-130106 | 6/2009 |

(Continued)

*Primary Examiner* — Nicole Ippolito
(74) *Attorney, Agent, or Firm* — Farjami & Farjami LLP

(57) ABSTRACT

A method that includes implantation of dopants while a III-nitride body is being grown on a substrate, and an apparatus for the practice of the method.

20 Claims, 1 Drawing Sheet

(56) References Cited

U.S. PATENT DOCUMENTS

| | | | |
|---|---|---|---|
| 8,093,597 B2 * | 1/2012 | Briere | 257/76 |
| 8,395,132 B2 * | 3/2013 | Briere | 250/492.3 |
| 8,692,219 B2 * | 4/2014 | Briere | 250/492.3 |
| 2004/0063289 A1 | 4/2004 | Ohta | |
| 2004/0107906 A1 | 6/2004 | Collins | |
| 2004/0207029 A1 | 10/2004 | Braddock | |
| 2005/0136627 A1 | 6/2005 | Melas | |
| 2005/0191828 A1 * | 9/2005 | Al-Bayati et al. | 438/514 |
| 2005/0196945 A1 | 9/2005 | Yun | |
| 2006/0219938 A1 | 10/2006 | Huang | |
| 2007/0004176 A1 | 1/2007 | Tauzin | |
| 2007/0075274 A1 * | 4/2007 | Reece et al. | 250/492.21 |
| 2008/0315129 A1 | 12/2008 | Briere | |
| 2010/0171126 A1 | 7/2010 | Briere | |
| 2011/0316003 A1 | 12/2011 | Murphy | |

FOREIGN PATENT DOCUMENTS

| | | |
|---|---|---|
| JP | 2009-266981 | 11/2009 |
| WO | WO 2009/029329 | 3/2009 |
| WO | WO 2010/051266 | 5/2010 |

* cited by examiner

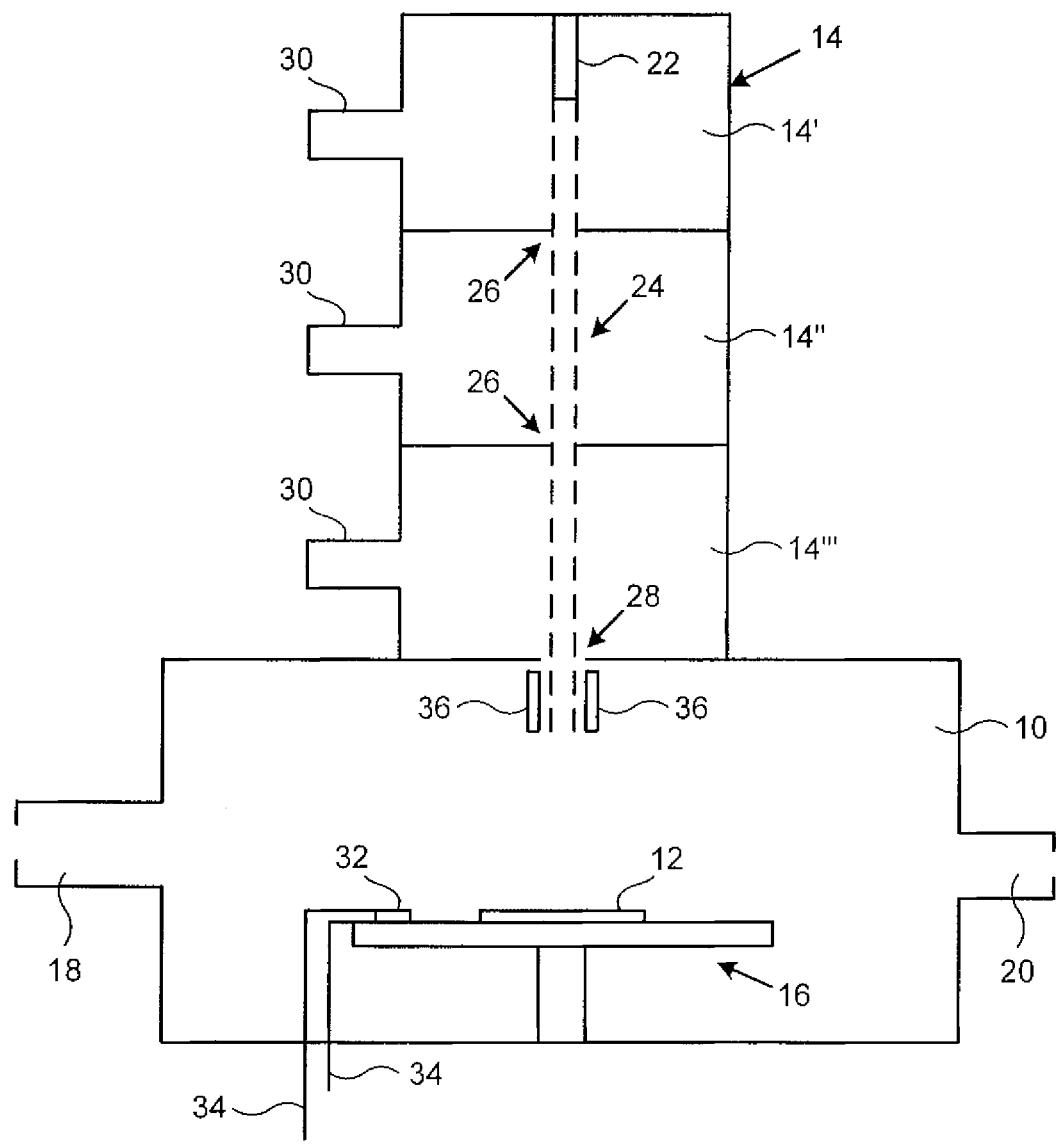

FABRICATION OF III-NITRIDE LAYERS

This is a continuation of application Ser. No. 13/788,318 filed Mar. 7, 2013.

This is a continuation of application Ser. No. 12/006,562 filed Jan. 3, 2008.

RELATED APPLICATION

This application is based on and claims priority to U.S. Provisional Application Ser. No. 60/937,101, filed on Jun. 25, 2007, entitled Ion Planting While Growing A III-Nitride Layer, to which a claim of priority is hereby made and the disclosure of which is incorporated by reference.

FIELD OF THE INVENTION

The present invention relates to semiconductor device fabrication and more particularly to III-nitride device fabrication.

DEFINITION

As referred to herein III-nitride refers to a semiconductor alloy from the InAlGaN system, including, but not limited to GaN, AlGaN, InAlGaN, AlN, InN, InGaN, and the like.

BACKGROUND OF THE INVENTION

Commercial interest in III-nitride devices is rapidly growing.

A basic problem in III-nitride device fabrication is the retention of the stoichiometry of the III-nitride body. Specifically, it is well known that at high temperatures (e.g. above 800° C.) nitrogen may escape from the III-nitride body resulting in the decomposition of the III-nitride. Thus, annealing after implantation presents a challenge in the field of III-nitride device fabrication, which is a technical barrier to the well known process of implantation and annealing used to form PN junctions in a semiconductor body.

SUMMARY OF THE INVENTION

The present invention relates to a process for semiconductor device fabrication, which can address the problem associated with the doping of a III-nitride body.

Thus, according to the present invention, a III-nitride body is doped while it is grown to obtain a doped III-nitride body, thereby avoiding the need for a high temperature anneal.

According to one embodiment of the present invention, a suitable substrate for the III-nitride body is placed in a reactor chamber for growing the III-nitride body (e.g. GaN body). The reactor chamber is equipped with an implanter for implanting any desired species. For example, Si can be used if an N-type III-nitride body is desired and Mg can be used if a P-type III-nitride body is desired. Thus, according to the present invention, as the III-nitride body is being grown in the reactor chamber it is implanted with the implanter to obtain a doped III-nitride body. Therefore, implanting takes place in an annealing environment rather than a decomposing environment. In a process according to the present invention, the surface of the growing body is at equilibrium with its surrounding. As a result, the surface does not decompose, while it is annealed.

While the method of growth is not critical to the practice of the present invention, each growth method may offer unique advantages over the others. Thus, the method of growth can be selected as desired according to its unique advantages.

It is known that at least partial vacuum in the reactor chamber may be required for implanting, while to grow a III-nitride body over a substrate a certain amount of gas pressure may be required. Thus, the implanting technique must be coupled with the growth technique.

According to one aspect of the present invention one or more stages of differential pumping can be used to obtain the gas pressure that is necessary for implanting and growth. This technique essentially relies on the finite conductance of gas molecules in a low pressure environment. The preferred pressure when MOCVD is used may be in the range 10-100 Torr, and if MBE is used the preferred pressure may be in the range $10^{-7}$ to $10^{-11}$ Torr. If MBE is used there may be no worries about neutralization which can occur in MOCVD.

In a method according to the present invention, low energies are preferred for implanting. Thus, energies less than tens of KeV (e.g. between 100 eV to tens of KeV) may be used with energies in the range of five to ten KeV being most preferred. Also, the implant beam can be as wide as 1/10 micron and not a few nm.

BRIEF DESCRIPTION OF THE FIGURES

FIG. 1 schematically illustrates an apparatus configured for the practice of a method according to the present invention.

DETAILED DESCRIPTION OF THE PREFERRED EMBODIMENTS

Referring to FIG. 1, an apparatus for the practice of a method according to the present invention includes a reactor chamber 10 for receiving a substrate 12 (e.g. silicon substrate, SiC substrate, III-nitride (e.g. GaN) substrate, sapphire substrate or the like), and an implanter chamber 14. Note that reactor chamber 10 may house also a rotating platform 16 on which substrate 12 is placed, and includes an intake port 18 to allow for the entry of a reactant gas and an output port 20 for the exit of reactant gas.

Disposed within implanter chamber 14 is an ion implanter 22 in communication with reactor chamber 10 through an ion path 24, which is the path along which ions travel from the implanter 22 into reactor chamber 10.

According to an aspect of the present invention, implanter chamber 14 is configured for maintaining a near vacuum condition within the enclosed space thereof. Near vacuum condition as referred to herein means a vacuum condition necessary to allow passage of ions through the enclosed space of implanter chamber 14 into reactor chamber 10. In order to obtain such a near vacuum condition while allowing implanter chamber 14 to be in communication with reactor chamber 10, differential pumping may be used to evacuate implanter chamber 14. For one embodiment, for example, implanter chamber 14 may be divided into several subchambers 14', 14", 14'". Each subchamber 14', 14", 14'" is in communication with an adjacent subchamber through a respective portal 26. Note that ion path 24 passes through each portal 26, and subchamber 14'", which is adjacent reactor chamber 10, is linked to reactor chamber 10 through a linking portal 28 through which ion path 24 also passes.

To create the near vacuum condition each subchamber 14', 14", 14'" is preferably evacuated using a respective pump 30. Each pump 30 is preferably in direct communication with the space enclosed by a respective subchamber as illustrated schematically by FIG. 1.

An apparatus according to the present invention may further include a Faraday cup 32 which may be disposed on platform 16 near substrate 12. Faraday cup 32 is preferably linked to a voltage meter or the like through appropriate means such as wires 34 so that the variation in the voltage thereof can be used to measure the dosage of ions being received from implanter 32 by substrate 12.

An apparatus according to the present invention may further include a plurality of deflection plates 36 positioned inside reactor chamber 10 on either side of portal 28. Deflection plates 36 can be used to change the direction of travel of the ions entering reactor chamber 10. Note that deflection plates 36 may be used to direct the ions at Faraday cup 32 periodically (e.g. 1% of the time) in order to measure the ion dosage being directed at substrate 12 in order to estimate the concentration of dopants implanted therein.

According to an embodiment of the present invention, a suitable substrate 12 (e.g. a silicon substrate) is placed on platform 16 inside reactor chamber 10. Reactant gas is then fed through intake port 18, and thermal conditions are set for the growth of a III-nitride body such as GaN, AlN, or the like. In addition, through differential pumping, subchambers 14', 14'', 14''' are evacuated until a suitable, near vacuum condition is obtained inside implanter chamber 14. The near vacuum condition may depend on the type of growth that is being practiced. For example, if III-nitride is being grown using MOCVD the pressure inside of implanter chamber 14 may be in the range of 10-100 Torr, or if MBE is used for growing the III-nitride body $10^{-7}$ to $10^{-11}$ Torr may be the pressure inside implanter chamber 14.

Once proper pressure is established in implanter chamber 14, any desired species may be implanted into the III-nitride body as it is being grown layer by layer. Thus, N-type dopants such as Si and P-type dopants such as Mg may be implanted.

According to one aspect of the present invention, to implant dopants, energies less than tens of keV (e.g. between 100 eV to tens of keV) are used for implantation. Preferably, energies in the range of five to ten keV are used during the implantation.

Moreover, the implant beam can be as wide as 1/10 microns wide not just a few nm. Note that according to an aspect of the present invention. The low energies are used in order to implant the dopants near the surface during the growth process (e.g. 50-200 Å depth) into the grown III-nitride body. The III-nitride body can be doped to any concentration, for example, the III-nitride semiconductor body can be doped with an ion dose in the range of $10^{12}/cm^2$ up to $10^{16}/cm^2$, with a dose of $10^{14}$ to $10^{15}$ being preferred.

According to another aspect of the present invention, the dosage of implants is measured to determine the concentration of dopants in the III-nitride body as it grows.

For example, to calculate the dose the number of electrons emitted can be counted. This technique may be most suitable for MBE.

In an alternative technique, the ion beam can be sampled 1% of the time by using a Faraday cup 32 residing on or near the substrate. Deflection plates can be used in the measurement of ion implantation. Faraday cup 32 on the wafer can be used to sample the charge that is implanted. However, negative ions may escape after implantation. To alleviate this problem a negative cover may repel the negative charge to get a better reading. Note that deflection plates (if used) should be positioned after the differential pumps.

A process according to the present invention can be used to dope the entire III-nitride body that is being grown on the substrate or it can be used to dope selected regions in the III-nitride body. Thus, to dope selected regions a metal mask can be used to allow doping only of regions not covered by the mask. For example, a projection ion beam mask or a stencil with parallel ion beams can used.

Alternatively, a direct writing rastering technique may be used. To directly write, a highly focused beam can used to implant selected regions without using a mask.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An apparatus comprising:
   a reactor chamber to receive a substrate and a reactant gas to grow a III-nitride semiconductor body on said substrate;
   an implanter chamber to implant ions into said III-nitride semiconductor body to dope said III-nitride semiconductor body during growth of said III-nitride semiconductor body such that said III-nitride semiconductor body is grown having at least one of N type conductivity and P type conductivity, said implanter chamber being separate from said reactor chamber;
   wherein said implanter chamber includes differential pumps.

2. The apparatus of claim 1, wherein said implanter chamber is in communication with said reactor chamber.

3. The apparatus of claim 1, wherein said differential pumps are configured to create a near vacuum condition in said implanter chamber.

4. The apparatus of claim 1, wherein each of said differential pumps is coupled to a respective subchamber of said implanter chamber.

5. The apparatus of claim 1, wherein said implanter chamber includes a plurality of subchambers in communication with one another.

6. The apparatus of claim 1, wherein an ion implanter is disposed within said implanter chamber and in communication with said reactor chamber through an ion path.

7. The apparatus of claim 1, further comprising deflection plates to change a direction of travel of said ions.

8. The apparatus of claim 1, further comprising a Faraday cup disposed within said reactor chamber.

9. The apparatus of claim 1, wherein said reactor chamber comprises a rotating platform for receiving said substrate.

10. A method comprising:
    placing a substrate in a reactor chamber;
    pumping reactant gas into said reactor chamber for growing a III-nitride semiconductor body on said substrate;
    implanting ions from an implanter chamber into said III-nitride semiconductor body to dope said III-nitride semiconductor body during growth of said III-nitride semiconductor body such that said III-nitride semiconductor body is grown having at least one of N type conductivity and P type conductivity;
    wherein said implanter chamber includes differential pumps.

11. The method of claim 10, wherein said ions pass through said implanter chamber under a near vacuum prior to reaching said substrate.

12. The method of claim 11, wherein said near vacuum is obtained using said differential pumps of said implanter chamber.

13. The method of claim 10, wherein an ion path extends from an ion implanter of said implanter chamber to said reactor chamber.

14. The method of claim 10, further comprising measuring a dosage of said ions while implanting takes place.

15. The method of claim 14, wherein said dosage is measured using a Faraday cup.

16. The method of claim 10, further comprising changing a direction of travel of said ions.

17. The method of claim 16, wherein deflection plates are used to change said direction of travel of said ions.

18. The method of claim 10, wherein each of said differential pumps is coupled to a respective subchamber of said implanter chamber.

19. The method of claim 10, wherein said implanter chamber comprises a plurality of subchambers in communication with one another.

20. The method of claim 10, wherein said reactor chamber comprises a rotating platform for receiving said substrate.

* * * * *